United States Patent
Jung

(10) Patent No.: US 10,780,548 B2
(45) Date of Patent: Sep. 22, 2020

(54) SURFACE PLATE CLEANING APPARATUS

(71) Applicant: SK Siltron Co., Ltd., Gumi-si, Gyeongsangbuk-do (KR)

(72) Inventor: Chan Min Jung, Gumi-si (KR)

(73) Assignee: SK Siltron Co., Ltd., Gumi-si (KR)

( * ) Notice: Subject to any disclaimer, the term of this patent is extended or adjusted under 35 U.S.C. 154(b) by 305 days.

(21) Appl. No.: 15/659,219

(22) Filed: Jul. 25, 2017

(65) Prior Publication Data
US 2018/0147691 A1 May 31, 2018

(30) Foreign Application Priority Data
Nov. 28, 2016 (KR) .................. 10-2016-0159035

(51) Int. Cl.
*B24B 53/017* (2012.01)
*H01L 21/67* (2006.01)
(Continued)

(52) U.S. Cl.
CPC ............. *B24B 53/017* (2013.01); *B01L 9/52* (2013.01); *B08B 3/02* (2013.01); *B08B 3/024* (2013.01);
(Continued)

(58) Field of Classification Search
CPC ..... B08B 3/02; B08B 3/024; H01L 21/67051; B24B 53/017; B24B 37/16; B01L 9/52
See application file for complete search history.

(56) References Cited

U.S. PATENT DOCUMENTS 4,272,924 A * 6/1981 Masuko .................. B24B 37/08
367/96
4,407,094 A * 10/1983 Bennett ................... B24B 49/00
318/478
(Continued)

FOREIGN PATENT DOCUMENTS

CN 103567163 2/2014
JP H09-029619 2/1997
(Continued)

OTHER PUBLICATIONS

Chinese Office Action dated Apr. 9, 2019 issued in Application No. 201710817249.5 (English translation attached).
(Continued)

*Primary Examiner* — Benjamin L Osterhout
(74) *Attorney, Agent, or Firm* — KED & Associates LLP

(57) ABSTRACT

Disclosed is a surface plate cleaning apparatus which cleans the surfaces of surface plates having grooves. The surface plate cleaning apparatus includes an injection unit including an injection head, and at least one first injection nozzle and at least one second injection nozzle, and a moving unit configured to move the injection unit, the at least one first injection nozzle includes a first injection hole to inject a first cleaning solution, the at least one second injection nozzle includes a second injection hole to inject a second cleaning solution, a first separation distance from the upper surface of the injection head to the first injection hole and a second separation distance from the upper surface of the injection head to the second injection hole are different, and a first injection angle of the first cleaning solution and a second injection angle of the second cleaning solution are different.

14 Claims, 5 Drawing Sheets

(51) Int. Cl.
  *B24B 37/16* (2012.01)
  *B01L 9/00* (2006.01)
  *B08B 3/02* (2006.01)
(52) U.S. Cl.
  CPC ........ *B24B 37/16* (2013.01); *H01L 21/67051* (2013.01)

(56) References Cited

U.S. PATENT DOCUMENTS

| | | | | |
|---|---|---|---|---|
| 4,433,510 | A * | 2/1984 | Katagiri | G01B 21/08 318/607 |
| 4,918,869 | A * | 4/1990 | Kitta | B24B 37/102 451/288 |
| 4,940,507 | A * | 7/1990 | Harbarger | B24B 37/28 156/345.14 |
| 6,148,463 | A * | 11/2000 | Shimizu | B08B 1/04 15/102 |
| 6,258,177 | B1 * | 7/2001 | Eastman, Jr. | B08B 3/026 134/145 |
| 7,793,671 | B2 * | 9/2010 | Jung | H01L 21/67051 134/137 |
| 2015/0000202 | A1 * | 1/2015 | Moudry | B24B 37/12 51/298 |

FOREIGN PATENT DOCUMENTS

| | | |
|---|---|---|
| JP | H 09-309063 | 12/1997 |
| JP | H11-028657 | 2/1999 |
| JP | 2000-176826 | 6/2000 |
| JP | 2000-246639 | 9/2000 |
| JP | 2001-237204 | 8/2001 |
| JP | 3678468 | 8/2005 |
| JP | 2012-179680 | 9/2012 |
| JP | 2015-044251 | 3/2015 |
| KR | 10-2010-0052028 | 5/2010 |
| KR | 10-1210297 | 12/2012 |

OTHER PUBLICATIONS

Japanese Notice of Allowance dated Sep. 25, 2018 issued in Application No. 2017-142528 (with English translation).
Japanese Office Action dated May 9, 2018 issued in Application No. 2017-142528.
Korean Office Action dated Jan. 23, 2018 issued in Application No. 10-2016-0159035.
Chinese Notice of Allowance dated Nov. 20, 2019 issued in Application No. 201710817249.5 (with English Translation).

* cited by examiner

SURFACE PLATE CLEANING APPARATUS

CROSS REFERENCE TO RELATED APPLICATION

This application claims the benefit of Korean Patent Application No. 10-2016-0159035, filed on Nov. 28, 2016 which is hereby incorporated by reference as if fully set forth herein.

BACKGROUND OF THE INVENTION

Field of the Invention

The present invention relates to a surface plate cleaning apparatus which is provided in a wafer lapping apparatus.

Discussion of the Related Art

In general, lapping is one processing method which is performed so as to acquire a surface having excellent flatness, and has been widely used to level the surface of a semiconductor wafer or the surfaces of various substrates.

In a general lapping process, a wafer is disposed between an upper surface plate and a lower surface plate of a lapping apparatus, and the upper and lower surface plates are rotated while supplying slurry for polishing to the wafer. Then, the surface of the wafer may be polished by abrasive particles contained in the slurry.

Grooves to effectively supply or discharge slurry may be provided on the surfaces of surface plates, for example, the upper and lower surface plates. If the lapping process is repeatedly carried out, foreign substances separated from the wafer and the surface plates and the used slurry may be accumulated in the grooves of the surface plates and, consequently, supply and discharge of the slurry may be hindered and thereby flatness of the wafer may be deteriorated. Further, if sludge accumulated in the grooves enters the wafer in the surface plates, the wafer may be scratched.

In order to solve such problems, a surface plate cleaning apparatus is used to periodically remove foreign substances and used slurry accumulated in grooves of surface plates.

SUMMARY OF THE INVENTION

Accordingly, the present invention is directed to a surface plate cleaning apparatus that substantially obviates one or more problems due to limitations and disadvantages of the related art.

An object of the present invention is to provide a surface plate cleaning apparatus which may improve flatness of a wafer caused by a lapping process and prevent generation of scratches on the wafer due to sludge.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a surface plate cleaning apparatus includes an injection unit including an injection head, and at least one first injection nozzle and at least one second injection nozzle disposed on the upper surface of the injection head, and a moving unit configured to move the injection unit to surfaces of surface plates to be cleaned, wherein the at least one first injection nozzle includes a first injection hole to inject a first cleaning solution, and the at least one second injection nozzle includes a second injection hole to inject a second cleaning solution, a first separation distance from the upper surface of the injection head to the first injection hole and a second separation distance from the upper surface of the injection head to the second injection hole are different, and a first injection angle of the first cleaning solution and a second injection angle of the second cleaning solution are different.

The second separation distance may be greater than the first separation distance.

The second injection angle may be smaller than the first injection angle.

The at least one first injection nozzle may include a plurality of first injection nozzles, the at least one second injection nozzle may include a plurality of second injection nozzles, a second separation distance of each of the second injection nozzles from the upper surface of the injection head may be greater than a first separation distance of each of the first injection nozzles from the upper surface of the injection head, and a second injection angle of the second cleaning solution injected from a second injection hole of each of the second injection nozzles may be smaller than a first injection angle of the first cleaning solution injected from a first injection hole of each of the first injection nozzles.

The first injection nozzles may be arranged in a line in a direction from one end to the other end of the injection head, and the second injection nozzles may be arranged in a line in a direction from one end to the other end of the injection head.

The first injection nozzles and the second injection nozzles may be alternately arranged in a direction from one end to the other end of the injection head.

The surface plates may include an upper surface plate having first grooves and a lower surface plate having second grooves, and the first injection nozzles and the second injection nozzles may inject the first and second cleaning solutions to the surface of the upper surface plate having the first grooves.

The injection unit may further include at least one third injection nozzle and at least one fourth injection nozzle disposed on the lower surface of the injection head, the at least one third injection nozzle may include a third injection hole to inject a third cleaning solution, the at least one fourth injection nozzle may include a fourth injection hole to inject a fourth cleaning solution, and a third separation distance from the lower surface of the injection head to the third injection hole and a fourth separation distance from the lower surface of the injection head to the fourth injection hole may be different.

A third injection angle of the third cleaning solution and a fourth injection angle of the fourth cleaning solution may be different.

The at least one third injection nozzle may include a plurality of third injection nozzles, the at least one fourth injection nozzle may include a plurality of fourth injection nozzles, a fourth separation distance of each of the fourth injection nozzles from the lower surface of the injection head may be greater than a third separation distance of each of the third injection nozzles from the lower surface of the injection head, and a fourth injection angle of the fourth cleaning solution injected from a fourth injection hole of each of the fourth injection nozzles may be smaller than a third injection angle of the third cleaning solution injected from a third injection hole of each of the third injection nozzles.

The third injection nozzles may be arranged in a line in a direction from one end to the other end of the injection head, and the fourth injection nozzles may be arranged in a line in a direction from one end to the other end of the injection head.

The third injection nozzles and the fourth injection nozzles may be alternately arranged in a direction from one end to the other end of the injection head.

Each of the first injection angle and the third injection angle may be 40° to 50°, and each of the second injection angle and the fourth injection angle may be 10° to 20°.

The injection pressure of the second cleaning solution injected from the at least one second injection nozzle may be higher than an injection pressure of the first cleaning solution injected from the at least one first injection nozzle, and an injection pressure of the fourth cleaning solution injected from the at least one fourth injection nozzle may be higher than an injection pressure of the third cleaning solution injected from the at least one third injection nozzle.

A diameter of each of the second and fourth injection holes may be smaller than a diameter of each of the first and third injection holes.

The surface plate cleaning apparatus may further include a supply pipe configured to supply the cleaning solutions to the first to fourth injection nozzles.

A difference between the first injection angle and the second injection angle may be 20° to 40°.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
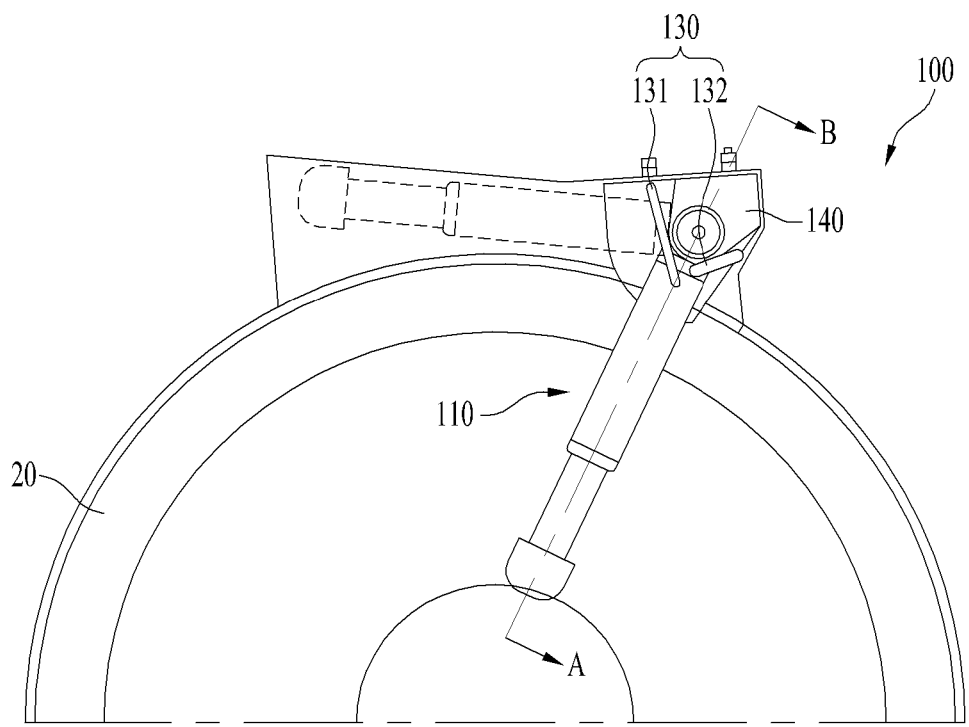
FIG. 1 is a plan view of a surface plate cleaning apparatus in accordance with one embodiment of the present invention.

Reference will now be made in detail to the preferred embodiments of the present invention, examples of which are illustrated in the accompanying drawings.

In the following description of the embodiments, it will be understood that, when each element is referred to as being "on" or "under" another element, it can be directly "on" or "under" the other element, or may be indirectly formed with one or more intervening elements therebetween. Further, it will be understood that, if each element is referred to as being "on" or "under" another element, these terms are intended to encompass not only an upward direction of one element but also a lower direction of the element.

In addition, it will be understood that, although the relational terms "first", "second", "on/above" and "under/below", etc. may not always require or encompass any physical or logical relations between substances or elements or order thereof, and be used only to describe any substance or element from another substance or element. Further, in the drawings, the same or similar elements are denoted by the same reference numerals even though they are depicted in different drawings.

Figure 2:
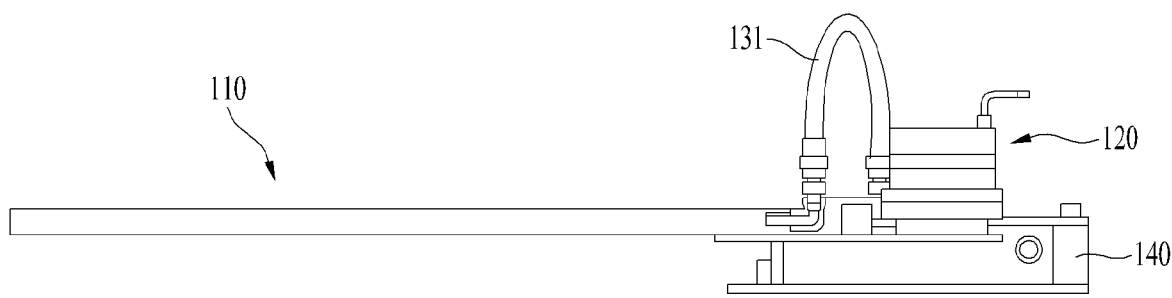
FIG. 2 is a cross-sectional view of an injection unit shown in FIG. 1, taken along line A-B.

FIG. 1 is a plan view of a surface plate cleaning apparatus 100 in accordance with one embodiment of the present invention, and FIG. 2 is a cross-sectional view of an injection unit 110 shown in FIG. 1, taken along line A-B.

With reference to FIGS. 1 and 2, the surface plate cleaning apparatus 100 includes an injection unit 110, a moving unit 120 and a fluid supply unit 130.

The injection unit 110 injects a high-pressure fluid, for example, a cleaning solution, toward the surfaces of surface plates, i.e., upper and lower surface plates 10 and 20, of a lapping apparatus, for example, a wafer polishing apparatus, thus cleaning the surfaces of the surface plates.

The moving unit 120 is combined with the injection unit 110 and moves the injection unit 110. For example, the moving unit 120 may be a robotic arm but is not limited thereto.

For example, the moving unit 120 may rotate the injection unit 110 so as to swing between the upper surface plate 10 and the lower surface plate 20.

For example, as exemplarily shown in FIG. 1, the moving unit 120 locates the injection unit 110 at the outside of the surface plate, for example, the lower surface plate 20, when a cleaning process is not performed (with reference to the injection unit 110 shown in a dotted line of FIG. 1).

Further, the moving unit 120 locates the injection unit 110 above the surface plate, for example, the lower surface plate 20, when the cleaning process is performed (with reference to the injection unit 110 shown in a solid line of FIG. 1).

Further, the moving unit 120 may move the injection unit 110 in the vertical direction or move the injection unit 110 in the horizontal direction. For example, the vertical direction may be a direction from the upper surface plate 10 to the lower surface plate 20 or a reverse direction thereof. The horizontal direction may be a direction from the edge of the upper or lower surface plate 10 or 20 to the center of the upper or lower surface plate 10 or 20 or a reverse direction thereof.

The surface plate cleaning apparatus 100 may further include a support unit or a stage 140 on which the moving unit 120 is mounted or by which the moving unit 120 is supported.

The fluid supply unit 130 supplies a fluid to the injection unit 110. For example, the fluid supply unit 130 may supply a cleaning solution, for example, deionized water (DIW), to the injection unit 110. Further, the fluid supply unit 130 may supply gas, for example, compressed air, to the injection unit 110.

For example, the fluid supply unit 130 may include a cleaning solution supply unit 131 to supply a cleaning solution and a gas supply unit 132 to supply gas, for example, air, at a predetermined pressure.

For example, the cleaning solution supply unit 131 may be connected to a first supply pipe 412 (with reference to FIGS. 4A and 4B) and supply a cleaning solution to first to fourth injection nozzles 312, 314, 322 and 324 of the injection unit 110 through the first supply pipe 412. Further, for example, the gas supply unit 132 may be connected to a second supply pipe 414 (with reference to FIGS. 4A and 4B) and supply gas to the injection unit 110 through the second supply pipe 414.

Figure 3:
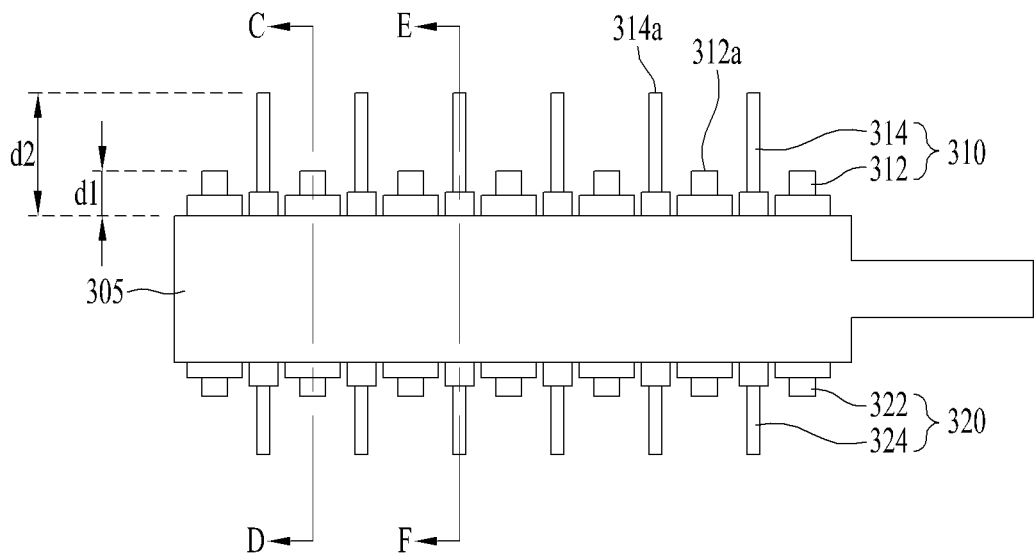
FIG. 3 is an enlarged view of the injection unit shown in FIG. 2.
Figure 4A:
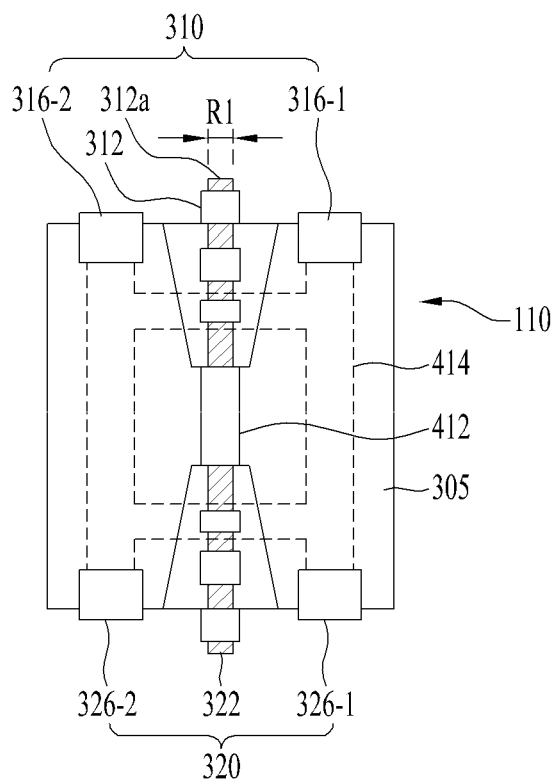
FIG. 4A is a cross-sectional view of the injection unit shown in FIG. 3, taken along line C-D.
Figure 4B:
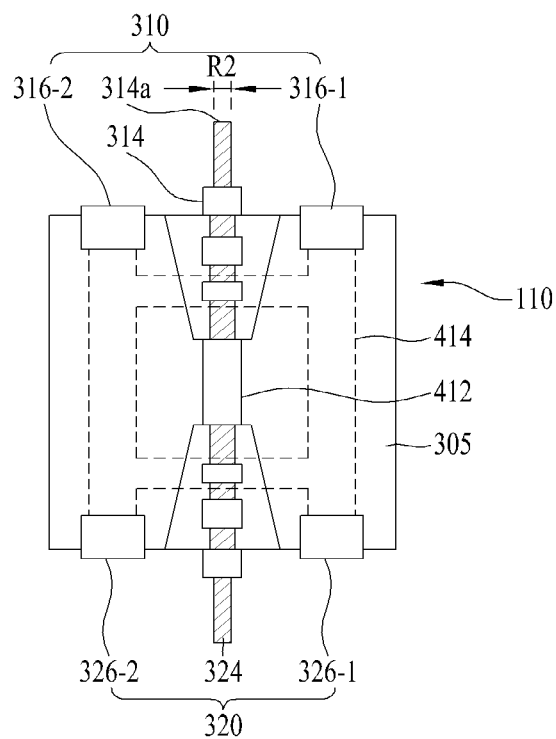
FIG. 4B is a cross-sectional view of the injection unit shown in FIG. 3, taken along line E-F.
Figure 5:
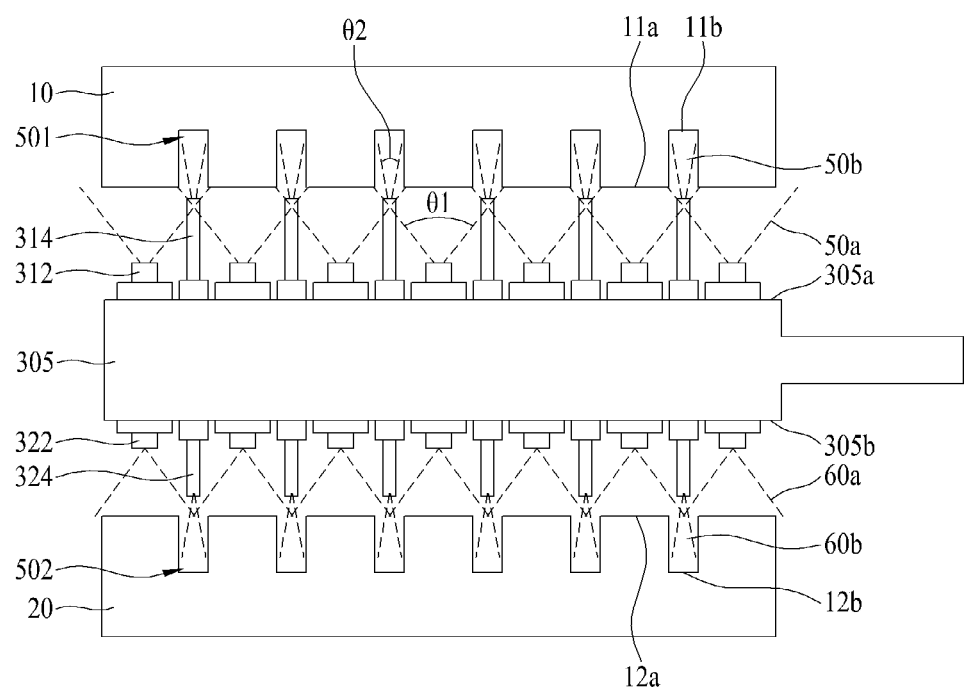
FIG. 5 is a view illustrating cleaning solutions injected from the injection unit toward an upper surface plate and a lower surface plate.

FIG. 3 is an enlarged view of the injection unit 110 shown in FIG. 2, FIG. 4A is a cross-sectional view of the injection unit 110 shown in FIG. 3, taken along line C-D, FIG. 4B is a cross-sectional view of the injection unit 110 shown in FIG. 3, taken along line E-F, and FIG. 5 is a view illustrating cleaning solutions 50a, 50b, 60a and 60b injected from the injection unit 110 toward the upper surface plate 10 and the lower surface plate 20.

With reference to FIGS. 3 to 5, the injection unit 110 includes an injection head 305, a first injection part 310, a second injection part 320, the first supply pipe 412 and the second supply pipe 414.

The injection head 305 receives the first and second injection parts 310 and 320 and the first and second supply pipes 412 and 414.

The first injection part 310 is disposed at one side of the injection head 305 and injects a cleaning solution and gas in the upward direction. The second injection part 320 is disposed at the other side of the injection head 305 and injects a cleaning solution and gas in the downward direction. For example, the first and second injection parts 310 and 320 may inject cleaning solutions 50a, 50b, 60a and 60b and gas in opposite directions.

The first and second injection parts 310 and 320 may include cleaning solution injection nozzles to inject the cleaning solution 50a, 50b, 60a and 60b, and gas injection nozzles to inject gas 316-1, 316-2, 326-1 and 326-2.

The injection unit 110 may include the injection head 305, at least one first injection nozzle 312 and at least one second injection nozzle 314.

For example, the number of the first injection nozzles 312 may be two or more, and the number of the second injection nozzles 314 may be two or more.

For example, the cleaning solution injection nozzles of the first injection part 310 of the injection unit 110 may include at least one first injection nozzle 312 and at least one second injection nozzle 314 exposed from one surface, for example, an upper surface 305a, of the injection head 305.

The first and second injection nozzles 312 and 314 may be disposed or mounted on the upper surface 305a of the injection head 305 and inject cleaning solutions toward an upper surface plate of a lapping apparatus.

As exemplarily shown in FIG. 3, a first separation distance d1 of a first injection hole 312a of the first injection nozzle 312 from the upper surface 305a of the injection head 305 differs from a second separation distance d2 of a second injection hole 314a of the second injection nozzle 314 from the upper surface 305a of the injection head 305.

For example, the second separation distance d2 may be greater than the first separation distance d1 (d2>d1).

Further, for example, first separation distances d1 of the first injection holes 312a of the first injection nozzles 312 from the upper surface 305a of the injection head 305 may be equal to one another and second separation distances d2 of the second injection holes 314a of the second injection nozzles 314 from the upper surface 305a of the injection head 305 may be equal to one another, but the disclosure is not limited thereto.

A diameter of the first injection nozzle 312 may differ from a diameter of the second injection nozzle 314. For example, the diameter of the first injection nozzle 312 may be smaller than the diameter of the second injection nozzle 314.

For example, a first diameter R1 of the first injection hole 312a of the first injection nozzle 312 may differ from a second diameter R2 of the second injection hole 314a of the second injection nozzle 314. For example, the second diameter R2 may be smaller than the first diameter R2 (R2<R1).

For example, the first diameters of the first injection nozzles 312 may be equal to one another and the second diameters of the second injection nozzles 314 may be equal to one another, but the disclosure is not limited thereto.

For example, the first diameters R1 of the first injection holes 312a of the first injection nozzles 312 may be equal to one another and the second diameters R2 of the second injection holes 314a of the second injection nozzles 314 may be equal to one another, but the disclosure is not limited thereto.

As exemplarily shown in FIG. 5, the first injection nozzles 312 may inject a first cleaning solution 50a in the upward direction or in a direction toward the upper surface plate 10, and the second injection nozzles 314 may inject a second cleaning solution 50b in the upward direction or in the direction toward the upper surface plate 10.

A first injection angle θ1 of the first cleaning solution 50a injected from the first injection holes 312a of the first injection nozzles 312 may differ from a second injection angle θ2 of the second cleaning solution 50b injected from the second injection holes 314a of the second injection nozzles 314. For example, the second injection angle θ2 may be smaller than the first injection angle θ1 (θ2<θ1).

For example, the first injection angle θ1 may be 40° to 50°. Further, for example, the first injection angle θ1 may be 45°.

For example, the second injection angle θ2 may be 10° to 20°. Further, for example, the second injection angle θ2 may be 15°.

A difference θ1−θ2 between the first injection angle θ1 and the second injection angle θ2 may be 20° to 40°. If the difference θ1−θ2 is less than 20°, removal effects of sludge located within grooves formed on the surface of a surface plate may be lowered. If the difference θ1−θ2 exceeds 40°, removal effects of sludge located on the surface of the surface plate (except for the insides of the grooves) may be lowered.

The first injection part 310 may include a plurality of first injection nozzles 312 spaced apart from one another, and a plurality of second injection nozzles 314 spaced apart from one another.

The first injection nozzles 312 may be disposed so as to be spaced apart from one another in a direction from one end to the other end of the injection head 305. For example, the first injection nozzles 312 may be arranged in a line in a direction from one end to the other end of the injection head 305.

The second injection nozzles 314 may be disposed so as to be spaced apart from one another in a direction from one end to the other end of the injection head 305. For example, the second injection nozzles 314 may be arranged in a line in a direction from one end to the other end of the injection head 305.

Further, the first and second injection nozzles 312 and 314 may be alternately disposed in a direction from one end to the other end of the injection head 305. For example, the first and second injection nozzles 312 and 314 may be arranged in a straight or curved line in a direction from one end to the other end of the injection head 305, but the disclosure is not limited thereto.

In accordance with another embodiment, cleaning solution injection nozzles of the first injection unit 310 may include a first line in which first injection nozzles are arranged in a direction from one end to the other end of the injection head 305, and a second line in which second injection nozzles are arranged in a direction from one end to the other end of the injection head 305. Here, the first line and the second line may be disposed so as to be parallel to each other or so as not to be parallel to each other.

Otherwise, for example, the first injection nozzles 312 and the second injection nozzles 314 may be arranged in a line in a direction from one end to the other end of the injection head 305.

Otherwise, for example, the first injection nozzles 312 and the second injection nozzles 314 may be disposed so as to zigzag in a direction from one end to the other end of the injection head 305.

In the surface plate cleaning apparatus 100 in accordance with this embodiment, the moving unit 120 may perform a swinging operation to move the injection unit 110 to a gap between the upper and lower surface plates 10 and 20 at the start time of the cleaning process, maintain the stopped state of the injection unit 110 without swinging during the cleaning process, and perform a swinging operation to move the injection unit 110 to the outside of the upper and lower surface plates 10 and 20 when the cleaning process is terminated.

Since the stopped state of the injection unit 110 between the upper surface plate 10 and the lower surface plate 20 is maintained during the cleaning process, in order to simultaneously clean the surfaces of the rotating upper and lower surface plates 10 and 20, the first and second injection nozzles 312 and 314 arranged in a line in a direction from one end to the other end of the injection head 305 may correspond to a region between the inner and outer circumferential surfaces of each of the upper surface plate 10 and the lower surface plate 20.

The first cleaning solution 50a injected from the first injection nozzles 312 may clean a first surface 11a of the upper surface plate 10, and the second cleaning solution 50b injected from the second injection nozzles 314 may clean a second surface 11b of the upper surface plate 10. Here, grooves 501 to effectively supply and discharge slurry during a polishing process may be provided on the second surface 11b. That is, the second surface 11b may be depressed from the first surface 11a and have a height difference with the first surface 11a.

In this embodiment, cleaning of the first surface 11a of the upper surface plate 10 by the first cleaning solution 50a injected from the first injection nozzles 312 and cleaning of the insides of the grooves 501 formed on the second surface 11b by the second cleaning solution 50b injected from the second injection nozzles 314 may be simultaneously performed. Therefore, a separate grooving process to remove foreign substances, for example, sludge, present in the grooves 501 is not required.

The gas injection nozzles 316-1 and 316-2 of the first injection part 310 may be disposed or mounted on the upper surface 305a of the injection head 305 and inject gas, for example, inert gas or air, to the upper surface plate 10 of the lapping apparatus. Gas injected from the gas injection nozzles 316-1 and 316-2 may serve to separate or remove foreign substances, etc. from the upper surface plate 10 during cleaning.

The gas injection nozzles 316-1 and 316-2 of the first injection part 310 may be disposed at both sides of the cleaning solution injection nozzles, but the disclosure is not limited thereto.

Further, the gas injection nozzles 316-1 and 316-2 of the first injection part 310 may be disposed or arranged so as to be spaced apart from one another in a direction from one end to the other end of the injection head 305. For example, the gas injection nozzles 316-1 and 316-2 of the first injection part 310 may be arranged so as to be spaced apart from one another in the same direction as the arrangement direction of the first and second injection nozzles 312 and 314. For example, the gas injection nozzles 316-1 and 316-2 of the first injection part 310 may be arranged in a line.

For example, the gas injection nozzles 316-1 and 316-2 of the first injection part 310 may be arranged in a line at both sides of the first and second injection nozzles 312 and 314, but the disclosure is not limited thereto. For example, in accordance with another embodiment, the gas injection nozzles 316-1 and 316-2 of the first injection part 310 may be arranged in a line at only one side of the first and second injection nozzles 312 and 314 or be omitted.

The cleaning solution injection nozzles of the second injection part 320 of the injection unit 110 may include at least one third injection nozzle 322 and at least one fourth injection nozzle 324 exposed from the other surface, for example, a lower surface 305b, of the injection head 305.

The injection unit 110 may further include at least one third injection nozzle 322 and at least one fourth injection nozzle 324

For example, the number of the third injection nozzles 322 may be two or more, and the number of the fourth injection nozzles 324 may be two or more.

A third separation distance of a third injection hole of the third injection nozzle 322 from the lower surface 305b of the injection head 305 differs from a fourth separation distance of a fourth injection hole of the fourth injection nozzle 324 from the lower surface 305b of the injection head 305.

For example, the fourth separation distance may be greater than the third separation distance.

Further, for example, third separation distances of third injection holes of the third injection nozzles 322 from the lower surface 305b of the injection head 305 may be equal to one another and fourth separation distances of fourth injection holes of the fourth injection nozzles 324 from the lower surface 305b of the injection head 305 may be equal to one another, but the disclosure is not limited thereto.

For example, the third separation distance may be equal to the first separation distance d1, and the fourth separation distance may be equal to the second separation distance d2.

Further, a third diameter of the third injection hole of the third injection nozzle 322 may differ from a fourth diameter of the fourth injection hole of the fourth injection nozzle 324. For example, the fourth diameter may be smaller than the third diameter.

For example, the third diameters of the third injection holes of the third injection nozzles 322 may be equal to one another and the fourth diameters of the fourth injection holes of the fourth injection nozzles 324 may be equal to one another, but the disclosure is not limited thereto.

For example, the fourth diameter may be equal to the second diameter R2, and the third diameter may be equal to the first diameter R1.

The third injection nozzles 322 may inject a third cleaning solution 60*a* in the downward direction or in a direction toward the lower surface plate 20, and the fourth injection nozzles 324 may inject a fourth cleaning solution 60*b* in the downward direction or in the direction toward the lower surface plate 20.

A third injection angle of the third cleaning solution 60*a* injected from the third injection holes of the third injection nozzles 322 may differ from a fourth injection angle of the fourth cleaning solution 60*b* injected from the fourth injection holes of the fourth injection nozzles 324. For example, the fourth injection angle may be smaller than the third injection angle.

For example, the third injection angle may be 40° to 50°. Further, for example, the third injection angle may be 45°. For example, the fourth injection angle may be 10° to 20°. Further, for example, the fourth injection angle may be 15°.

A difference between the third injection angle and the fourth injection angle may be 20° to 40°. If the difference between the third injection angle and the fourth injection angle is less than 20°, removal effects of sludge located within grooves formed on the surface of a surface plate may be lowered. If the difference between the third injection angle and the fourth injection angle exceeds 40°, removal effects of sludge located on the surface of the surface plate (except for the insides of the grooves) may be lowered.

The second injection part 320 may include a plurality of third injection nozzles 322 spaced apart from one another, and a plurality of fourth injection nozzles 324 spaced apart from one another.

The above description of the arrangement of the first injection nozzles 312 and the second injection nozzles 314 may be applied to the arrangement of the third injection nozzles 322 and the fourth injection nozzles 324.

The third injection nozzles 322 may be disposed so as to be spaced apart from one another in a direction from one end to the other end of the injection head 305. For example, the third injection nozzles 322 may be arranged in a line in a direction from one end to the other end of the injection head 305.

The fourth injection nozzles 324 may be disposed so as to be spaced apart from one another in a direction from one end to the other end of the injection head 305. For example, the fourth injection nozzles 324 may be arranged in a line in a direction from one end to the other end of the injection head 305.

Further, the third and fourth injection nozzles 322 and 324 may be alternately disposed in a direction from one end to the other end of the injection head 305. For example, the third and fourth injection nozzles 322 and 324 may be arranged in a straight or curved line in a direction from one end to the other end of the injection head 305, but the disclosure is not limited thereto.

In accordance with another embodiment, cleaning solution injection nozzles of the second injection unit 320 may include a third line in which third injection nozzles are arranged in a direction from one end to the other end of the injection head 305, and a fourth line in which fourth injection nozzles are arranged in a direction from one end to the other end of the injection head 305. Here, the third line and the fourth line may be disposed so as to be parallel to each other or so as not to be parallel to each other.

The third cleaning solution 60*a* injected from the third injection nozzles 322 may clean a first surface 12*a* of the lower surface plate 20, and the fourth cleaning solution 60*b* injected from the fourth injection nozzles 324 may clean a second surface 12*b* of the lower surface plate 20.

Here, grooves 502 to effectively supply and discharge slurry during the polishing process may be provided on the second surface 12*b* of the lower surface plate 20. The second surface 12*b* may be depressed from the first surface 12*a* and have a height difference with the first surface 12*a*.

The gas injection nozzles 326-1 and 326-2 of the second injection part 320 may be disposed or mounted on the lower surface 305*b* of the injection head 305 and inject gas, for example, inert gas or air, toward the lower surface plate 20 of the lapping apparatus. Gas injected from the gas injection nozzles 326-1 and 326-2 may serve to separate or remove foreign substances, etc. from the lower surface plate 20 during cleaning.

The gas injection nozzles 326-1 and 326-2 of the second injection part 320 may be disposed at both sides of the cleaning solution injection nozzles, but the disclosure is not limited thereto.

Further, the gas injection nozzles 326-1 and 326-2 of the second injection part 320 may be disposed so as to be spaced apart from one another in a direction from one end to the other end of the injection head 305. The above description of the gas injection nozzles 316-1 and 316-2 of the first injection part 310 may be applied to the gas injection nozzles 326-1 and 326-2 of the second injection part 320.

As exemplarily shown in FIGS. 4A and 4B, a cleaning solution supplied from the cleaning solution supply unit 131 may be supplied to the first and second injection nozzles 312 and 314 of the first injection part 310 and the third and fourth injection nozzles 322 and 324 of the second injection part 320 through the first supply pipe 412.

Although FIGS. 4A and 4B illustrate one first supply pipe 412 as being used to supply the cleaning solution to the first and second injection parts 310 and 320, the disclosure is not limited thereto and the cleaning solution may be respectively supplied to the first and second injection parts 310 and 320 through separate supply pipes.

An injection pressure of the second cleaning solution 50*b* injected from the second injection nozzles 314 may be higher than an injection pressure of the first cleaning solution 50*a* injected from the first injection nozzles 312.

Further, an injection pressure of the fourth cleaning solution 60*b* injected from the fourth injection nozzles 324 may be higher than an injection pressure of the third cleaning solution 60*a* injected from the third injection nozzles 322.

The reason for this is that, although the cleaning solution may be supplied at the same pressure to the first to fourth injection nozzles 312, 314, 322 and 324 through the first supply pipe 412, the second diameter of the second injection holes 314*a* of the second injection nozzles 314 is smaller than the first diameter of the first injection holes 312*a* of the first injection nozzles 312 and the fourth diameter of the fourth injection holes of the fourth injection nozzles 324 is smaller than the third diameter of the third injection holes of the third injection nozzles 322.

In accordance with another embodiment, the cleaning solution may be supplied at different pressures to the first and second injection nozzles 312 and 314 and the cleaning solution may be supplied at different pressures to the third and fourth injection nozzles 322 and 324, through separate supply pipes.

The first and second cleaning solutions 50a and 50b may be simultaneously injected to the upper surface plate 10 through the first and second injection nozzles 312 and 314, and the third and fourth cleaning solutions 60a and 60b may be simultaneously injected to the lower surface plate 20 through the third and fourth injection nozzles 322 and 324.

Figure 6A:
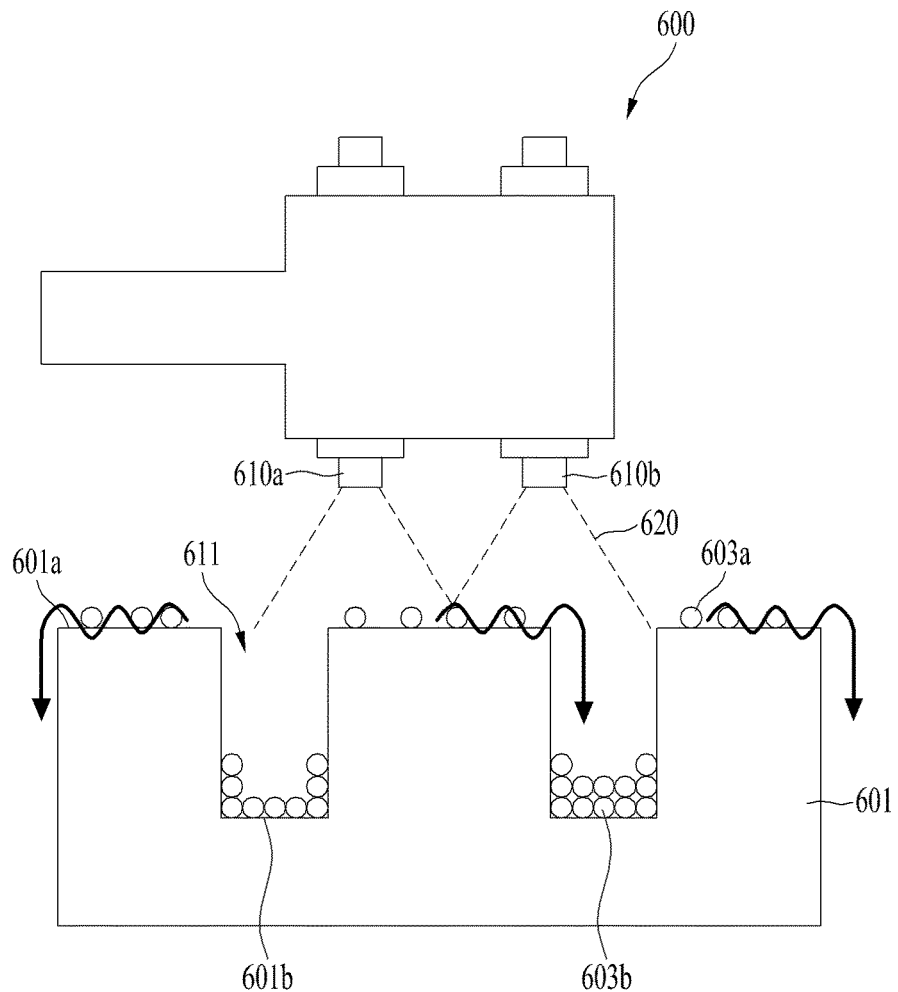
FIG. 6A is a schematic view illustrating cleaning of a surface plate by a general surface plate cleaning apparatus.
Figure 6B:
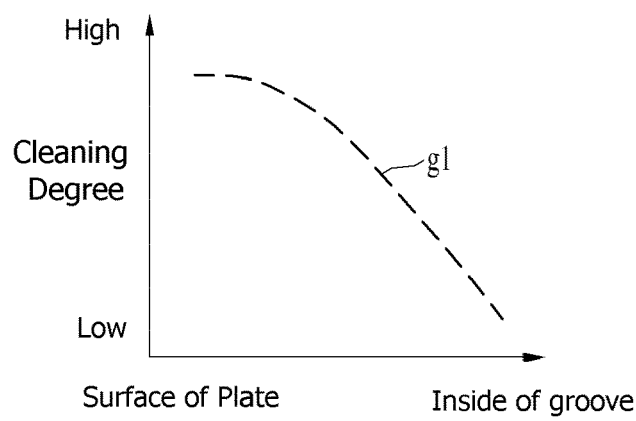
FIG. 6B is a graph representing a cleaning degree of the surface plate by the surface plate cleaning apparatus shown in FIG. 6A.

FIG. 6A is a schematic view illustrating cleaning of a surface plate by a general surface plate cleaning apparatus 600, and FIG. 6B is a graph g1 representing a cleaning degree of the surface plate by the surface plate cleaning apparatus 600 shown in FIG. 6A.

With reference to FIG. 6A, injection nozzles 610a and 610b inject a cleaning solution 620 to first and second surfaces 601a and 601b of a surface plate 601 under the condition that the injection nozzles 610a maintain a uniform distance from the first surface 601a of the surface plate 601. By the injected cleaning solution 620, sludge located on the first surface 601a of the surface plate 601 may be removed but sludge located within grooves 611 formed on the second surface 601b of the surface plate 601 is not removed. Furthermore, sludge located on the first surface 601a may enter the grooves 611.

In FIG. 6B, the x-axis represents a position or distance from the first surface 601a to the groove 611 of the second surface 601b of the surface plate 601, and the y-axis represents a cleaning degree.

With reference to FIG. 6B, the first surface 601a of the surface plate 601 has the highest cleaning degree, and the groove 611 of the second surface 601b of the surface plate 601 has the lowest cleaning degree. Due to sludge in the grooves 611 which is not removed, the quality of flatness of a wafer, the lapping process of which has been executed by a lapping apparatus, may be lowered. Further, if sludge accumulated within the grooves 611 enters the wafer, the wafer may be scratched.

Figure 7A:
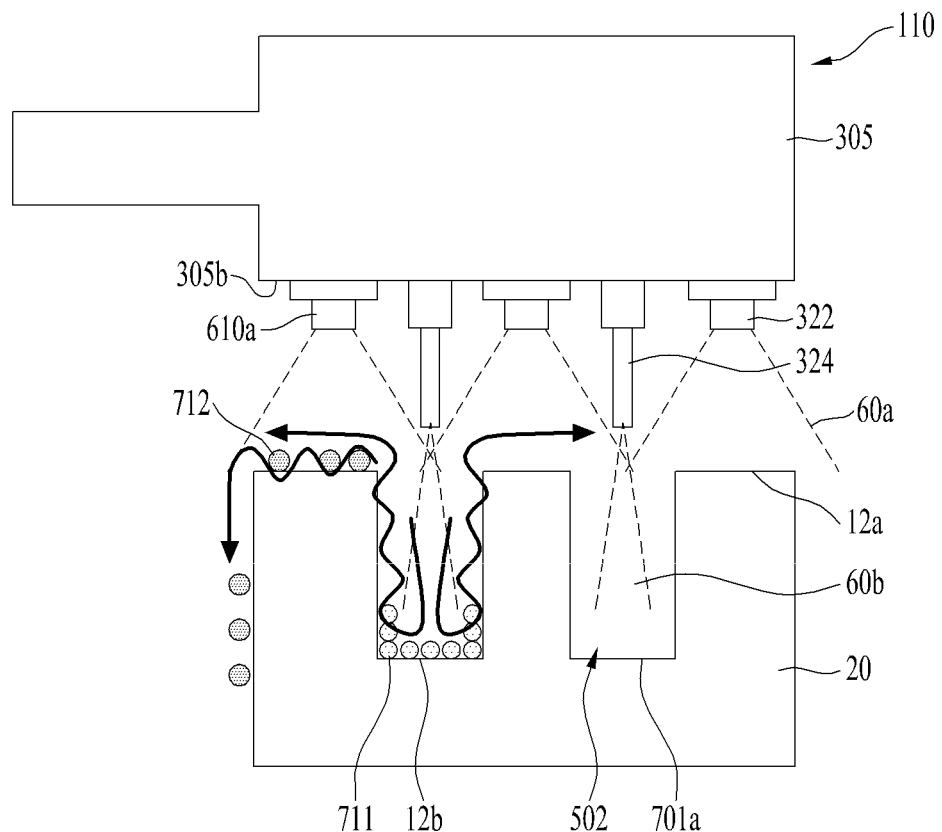
FIG. 7A is a schematic view illustrating cleaning of a surface plate by an injection unit of a surface plate cleaning apparatus in accordance with one embodiment of the present invention.
Figure 7B:
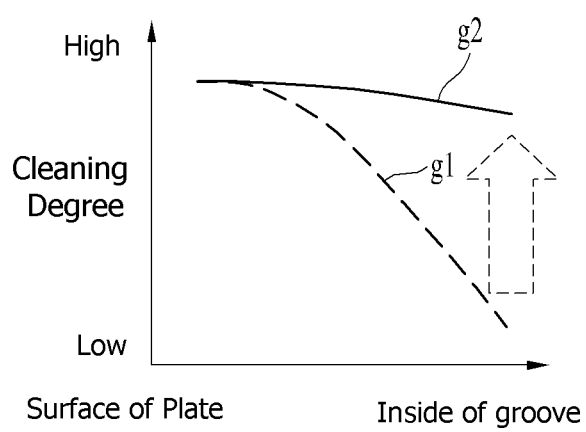
FIG. 7B is a graph representing a cleaning degree of the surface plate by the surface plate cleaning apparatus shown in FIG. 7A.

FIG. 7A is a schematic view illustrating cleaning of a surface plate by an injection unit 110 of a surface plate cleaning apparatus 100 in accordance with one embodiment of the present invention, and FIG. 7B is a graph g2 representing a cleaning degree of the surface plate by the surface plate cleaning apparatus shown in FIG. 7A.

With reference to FIGS. 7A and 7B, a fourth separation distance of a fourth injection hole of a fourth injection nozzle 324 from a lower surface 305b of an injection head 305 is greater than a third separation distance of a third injection hole of a third injection nozzle 323 from the lower surface 305b of the injection head 305 and, thus, a distance between the fourth injection hole and a bottom 502a of a groove 502 formed on a second surface 12b of a lower surface plate 20 is smaller than a distance between the third injection hole and the bottom 502a of the groove 502.

A fourth injection angle of a fourth cleaning solution 60b is smaller than a third injection angle of a third cleaning solution 60a and, thus, the fourth cleaning solution 60b may be injected directly into the groove 502 of the lower surface plate 20.

Sludge 712 located on the first surface 12a of the lower surface plate 20 may be removed by the third cleaning solution 60a injected from the third nozzles 322.

The fourth cleaning solution 60b injected from the fourth nozzles 324 may be injected directly into the grooves 502 of the lower surface plate 20, and sludge 711 present within the grooves 502 may be separated to the outside of the grooves 502 and thus removed to the outside of the lower surface plate 20 by the fourth cleaning solution 60 injected directly into the grooves 502 of the lower surface plate 20.

As exemplarily shown in FIG. 7B, as compared to the graph g1, in the graph g2, a cleaning degree of the insides of the grooves 502 is improved. Thereby, smooth flow of sludge through the grooves 502 may be acquired and, as a result, flatness of a wafer caused by the lapping process may be improved and generation of scratches on the wafer due to sludge may be prevented.

The above description of cleaning improvement effects of the lower surface plate 20 given with reference to FIGS. 7A and 7B may also be applied to cleaning of the upper surface plate 10 by the first injection part 310.

As is apparent from the above description, a surface plate cleaning apparatus in accordance with one embodiment of the present invention may improve flatness of a wafer caused by a lapping process and prevent generation of scratches on the wafer due to sludge.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A surface plate cleaning apparatus for cleaning a surface of at least one surface plate having groove, comprising:

an injection unit including an injection head, and at least one first injection nozzle and at least one second injection nozzle disposed on an upper surface of the injection head; and a moving unit configured to move the injection unit to the surface of the at least one surface plate to be cleaned, wherein:

the at least one first injection nozzle includes a first injection hole to inject a first cleaning solution to the surface of the at least one surface plate, and the at least one second injection nozzle includes a second injection hole to inject a second cleaning solution to the surface of the at least one surface plate;

wherein a second separation distance from the upper surface of the injection head to the second injection hole is greater than a first separation distance from the upper surface of the injection head to the first injection hole, wherein a second injection angle of the second cleaning solution injected from the second injection hole to the surface of the at least one surface plate is smaller than a first injection angle of the first cleaning solution injected from the first injection hole to the surface of the at least one surface plate, wherein the groove is to supply and discharge slurry during a polishing process, and wherein a distance between the second injection hole and a bottom of the groove is smaller than a distance between the first injection hole and the bottom of the groove so that the second cleaning solution is injected directly into the groove.

2. The surface plate cleaning apparatus for cleaning the surface of the at least one surface plate having the groove according to claim 1, wherein:
the at least one first injection nozzle includes a plurality of first injection nozzles;
the at least one second injection nozzle includes a plurality of second injection nozzles;
the second separation distance of each of the second injection nozzles from the upper surface of the injection head is greater than the first separation distance of each of the first injection nozzles from the upper surface of the injection head; and
the second injection angle of the second cleaning solution injected from the second injection hole of each of the second injection nozzles is smaller than the first injection angle of the first cleaning solution injected from the first injection hole of each of the first injection nozzles.

3. The surface plate cleaning apparatus for cleaning the surface of the at least one surface plate having the groove according to claim 2, wherein:
the first injection nozzles are arranged in a line in a direction from an end to the another end of the injection head; and
the second injection nozzles are arranged in a line in the direction from the end to the another end of the injection head.

4. The surface plate cleaning apparatus for cleaning the surface of the at least one surface plate having the groove according to claim 3, wherein the first injection nozzles and the second injection nozzles are alternately arranged in the direction from the end to the another end of the injection head.

5. The surface plate cleaning apparatus for cleaning the surface of the at least one surface plate having the groove according to claim 2, wherein:
the at least one surface plate includes an upper surface plate having first grooves and a lower surface plate having second grooves; and
the first injection nozzles and the second injection nozzles inject the first and second cleaning solutions to a lower surface of the upper surface plate having the first grooves.

6. The surface plate cleaning apparatus for cleaning the surface of the at least one surface plate having the groove according to claim 5, wherein the injection unit further includes at least one third injection nozzle and at least one fourth injection nozzle disposed on a lower surface of the injection head, wherein:
the at least one third injection nozzle includes a third injection hole to inject a third cleaning solution to an upper surface of the lower surface plate having the second grooves, and the at least one fourth injection nozzle includes a fourth injection hole to inject a fourth cleaning solution to the upper surface of the lower surface plate having the second grooves; and
a third separation distance from the lower surface of the injection head to the third injection hole and a fourth separation distance from the lower surface of the injection head to the fourth injection hole are different.

7. The surface plate cleaning apparatus for cleaning the surface of the at least one surface plate having the groove according to claim 6, wherein:
the at least one third injection nozzle includes a plurality of third injection nozzles;
the at least one fourth injection nozzle includes a plurality of fourth injection nozzles;
the fourth separation distance of each of the fourth injection nozzles from the lower surface of the injection head is greater than the third separation distance of each of the third injection nozzles from the lower surface of the injection head; and
a fourth injection angle of the fourth cleaning solution injected from the fourth injection hole of each of the fourth injection nozzles is smaller than a third injection angle of the third cleaning solution injected from the third injection hole of each of the third injection nozzles.

8. The surface plate cleaning apparatus for cleaning the surface of the at least one surface plate having the groove according to claim 7, wherein:
the third injection nozzles are arranged in a line in the direction from the end to the another end of the injection head; and
the fourth injection nozzles are arranged in a line in the direction from the end to the another end of the injection head.

9. The surface plate cleaning apparatus for cleaning the surface of the at least one surface plate having the groove according to claim 8, wherein the third injection nozzles and the fourth injection nozzles are alternately arranged in the direction from the end to the another end of the injection head.

10. The surface plate cleaning apparatus for cleaning the surface of the at least one surface plate having the groove according to claim 7, wherein:
each of the first injection angle and the third injection angle is 40° to 50°; and
each of the second injection angle and the fourth injection angle is 10° to 20°.

11. The surface plate cleaning apparatus for cleaning the surface of the at least one surface plate having the groove according to claim 6, wherein:
an injection pressure of the second cleaning solution injected from the at least one second injection nozzle is higher than an injection pressure of the first cleaning solution injected from the at least one first injection nozzle; and
an injection pressure of the fourth cleaning solution injected from the at least one fourth injection nozzle is higher than an injection pressure of the third cleaning solution injected from the at least one third injection nozzle.

12. The surface plate cleaning apparatus for cleaning the surface of the at least one surface plate having the groove according to claim 6, wherein a diameter of each of the second and fourth injection holes is smaller than a diameter of each of the first and third injection holes.

13. The surface plate cleaning apparatus for cleaning the surface of the at least one surface plate having the groove according to claim 12, further comprising a supply pipe configured to supply the cleaning solutions to the first to fourth injection nozzles.

14. The surface plate cleaning apparatus for cleaning the surface of the at least one surface plate having the groove according to claim 7, wherein a difference between the first injection angle and the second injection angle is 20° to 40°.

* * * * *